(12) United States Patent
Bremond et al.

(10) Patent No.: US 6,292,347 B1
(45) Date of Patent: Sep. 18, 2001

(54) ELECTRIC ARC GENERATION CIRCUIT

(75) Inventors: André Bremond, Veretz; Philippe Merceron, Vernon, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/364,521

(22) Filed: Jul. 30, 1999

(30) Foreign Application Priority Data

Aug. 4, 1998 (FR) .................................................. 98 10167

(51) Int. Cl.[7] .................................................. H03K 3/57
(52) U.S. Cl. ........................ 361/253; 361/256; 361/257
(58) Field of Search .................................. 361/247, 253, 361/256, 257, 263

(56) References Cited

U.S. PATENT DOCUMENTS

| | | | |
|---|---|---|---|
| 3,393,039 | * 7/1968 | Eldridge, Jr. et al. | 431/70 |
| 3,681,001 | * 8/1972 | Potts | 431/264 |
| 3,938,940 | * 2/1976 | Bauer | 431/79 |
| 4,203,052 | * 5/1980 | Bechtel | 361/256 |
| 4,358,813 | * 11/1982 | Sato et al. | 361/263 |
| 4,521,825 | 6/1985 | Crawford | 361/253 |
| 4,683,518 | * 7/1987 | Gwozdz | 361/263 |
| 4,965,860 | 10/1990 | Jochi | 219/113 |
| 5,473,502 | * 12/1995 | Bonavia et al. | 361/263 |

FOREIGN PATENT DOCUMENTS

3220442 * 4/1983 (DE) .................. B60Q/9/00

OTHER PUBLICATIONS

French Search Report from French Patent Application 98 10167, filed Aug. 4, 1998.

* cited by examiner

*Primary Examiner*—Fritz Fleming
(74) *Attorney, Agent, or Firm*—Wolf, Greenfield & Sacks, P.C.; James H. Morris; Theodore E. Galanthay

(57) ABSTRACT

A circuit of electric arc generation from an A.C. voltage, includes circuitry for making the electric arc frequency substantially independent from possible amplitude variations of the A.C. voltage.

17 Claims, 4 Drawing Sheets

ELECTRIC ARC GENERATION CIRCUIT

BACKGROUND OF THE INVENTION

1. Field of the Invention

The present invention relates to electric arc generation circuits. More specifically, the present invention relates to circuits in which such arcs are generated from an A.C. voltage.

2. Discussion of the Related Art

FIG. 1 illustrates a conventional example of a circuit 1 generating electric arcs adapted to igniting a fuel gas, for example, in an industrial enclosure, or in a domestic application to a gas oven, to the burners of a gas cooker, or to an independent gas lighter. Circuit 1 includes two input terminals I1 and I2 for receiving an A.C. supply voltage Vac, for example, the mains voltage, typically 220 volts at 50 Hz (or 110 volts at 60 Hz). Circuit 1 includes, in series between its terminals I1 and I2, a resistor R1, a diode DR, a capacitor C, and a primary winding L1 of an isolation transformer including one or several secondary windings L2. A pair of electrodes (not shown) is associated with each of secondary windings L2 of the transformer. Each pair is at a location where an electric arc is required, and its electrodes are at a small distance from each other. Circuit 1 also includes, in parallel with capacitor C and winding L1, a means FLC for organizing the charge and discharge of capacitor C. Means FLC includes, in antiparallel, a cathode-gate thyristor Th1 and a diode D1. The gate of thyristor Th1 is connected to the anode of a zener diode DZ1, the cathode of which is connected to the anode of thyristor Th1.

The operation of circuit 1 is described hereafter in relation with FIGS. 2 and 3. FIG. 2 illustrates the shape of current Ic in capacitor C (FIG. 1). FIG. 3 schematically illustrates the shape of voltage Vc across the capacitor.

During positive halfwaves of voltage Vac, capacitor C charges via diode DR and resistor R1. More precisely, diode DR is on when voltage Vac is greater than charge level Vc and the capacitor charges. In all other cases and, in particular, during negative halfwaves of voltage Vac, diode DR is blocked (nonconducting). All along the charge of capacitor C, thyristor Th1 is off.

It should be noted that several positive halfwaves of voltage Vac are necessary to reach the required charge level, controlled as described hereafter.

Indeed, as illustrated in FIG. 3, as long as voltage Vac has not reached a level VZ1, the capacitor pursues its charge at each halfwave. This results, for the shape of voltage Vc, in an increase by steps corresponding to several halfwaves and, for current Ic, to an exponential decrease of the maximum amplitudes of the charge current peaks along the halfwaves.

When voltage Vc reaches threshold VZ1, for example, 250 volts, determined by zener diode DZ1, the latter starts an avalanche (time t1) and a gate current triggers transistor Th1. Diode DR blocks and the capacitor abruptly discharges into primary winding L1 via the thyristor which is then used as a free wheel component. This discharge creates in the primary winding an increase (negative peak P with the sign conventions of FIG. 2) of the current which is reproduced at the secondary (by conservation of the magnetic energy). On the secondary side, this current variation results in an overvoltage across each winding L2 and thus across the corresponding electrodes, which creates an electric arc across these electrodes.

Thyristor Th1 turns off as the current flowing therethrough disappears, that is, when the capacitor is completely discharged. Diode D1 is then used as a free wheel diode to discharge the current associated with the reactive energy of the transformer as long as diode DR has not turned back on.

Then, at the beginning of the positive halfwave following this discharge (this arc), diode DR turns back on and capacitor C starts charging again in the way previously described until a time t1' when voltage Vc reaches level VZ1 again.

The time interval (t1'–t1) between two discharges (arcs) corresponds to the capacitor charge time before reaching threshold VZ1. This time thus conventionally depends on the level of supply voltage Vac.

This is a disadvantage of this type of electric arc generation circuits, since supply voltage Vac, for example, the mains voltage, can have random level variations. Such variations cause variations of the electric arc emission frequency.

If the level of voltage Vac increases, the capacitor charges faster, the arc frequency increases and can become too high, typically almost 10 Hz, and problems of electromagnetic compatibility arise.

This frequency problem also occurs in circuits where for other reasons, the arcs are synchronized on the frequency of voltage Vac. A drawback is then that the arc frequency is equal to the frequency (50 Hz) of voltage Vac, which is too high. This is the case of the gas lighter disclosed in UK application No. 2 130 646.

If the level of voltage Vac decreases, the capacitor charges slower, the arc frequency decreases and can become too low, typically under 2 Hz, which causes an accumulation of the gas to be ignited. Such an accumulation can raise security problems.

Now, electric distribution companies do not guarantee a constant voltage. The voltage can vary, for example, by ±20% with respect to the 220-volt mains voltage at 50 Hz. A value of 170 volts then corresponds to a 1.6-Hz arc frequency, and a value of 250 volts corresponds to a 6-Hz arc frequency.

Another disadvantage of a conventional circuit such as shown in FIG. 1 is that threshold VZ1 of zener diode DZ1 is likely to have variations due to technological dispersion and to operating drifts (temperature, etc.). Now, this threshold determines the arc periodicity.

SUMMARY OF THE INVENTION

The present invention aims at providing a novel electric arc generation circuit in which the capacitor charge rate is always sufficient to enable generation of electric arcs at a sufficiently high frequency to avoid gas accumulation.

The present invention also aims at providing an electric arc generation circuit at a sufficiently low frequency to avoid disturbing its environment by electromagnetic disturbances.

More generally, the present invention aims at providing an electric arc generation circuit of approximately regular frequency.

To achieve these and other objects, the present invention provides a circuit of electric arc generation from an A.C. voltage, including means for making the electric arc frequency substantially independent from possible amplitude variations of the A.C. voltage, while being lower than the frequency of the A.C. voltage.

According to an embodiment of the present invention, the arcs are generated by means of an isolation transformer, the primary winding of which is connected in series with a capacitor, and the circuit includes means for organizing the capacitor charge and discharge, the charge being performed at a substantially constant current.

According to an embodiment of the present invention, the means for organizing the capacitor charge and discharge include a constant current source and a switching block.

According to an embodiment of the present invention, the current source and the switching block are made in the form of a single integrated circuit.

According to an embodiment of the present invention, the current source includes, on the charge path of the capacitor, a first resistive element associated with a means setting the voltage thereacross.

According to an embodiment of the present invention, the means setting the voltage across the first resistive element is formed of a zener diode having a low threshold with respect to the A.C. voltage, and the current source includes a means for limiting the avalanche current in the zener diode.

According to an embodiment of the present invention, the current limiting means further is a means of control of a switch in series with the first resistive element.

According to an embodiment of the present invention, the switching block includes a controllable switch on the discharge path of the capacitor, a means of detection of the charge level of the capacitor, and a free wheel component.

According to an embodiment of the present invention, the A.C. voltage is a low frequency voltage.

The present invention also aims at an electric gas lighter, including an electric arc generation circuit of the above type.

The foregoing objects, features and advantages of the present invention will be discussed in detail in the following non-limiting description of specific embodiments in connection with the accompanying drawings.

DETAILED DESCRIPTION

Figure 1:
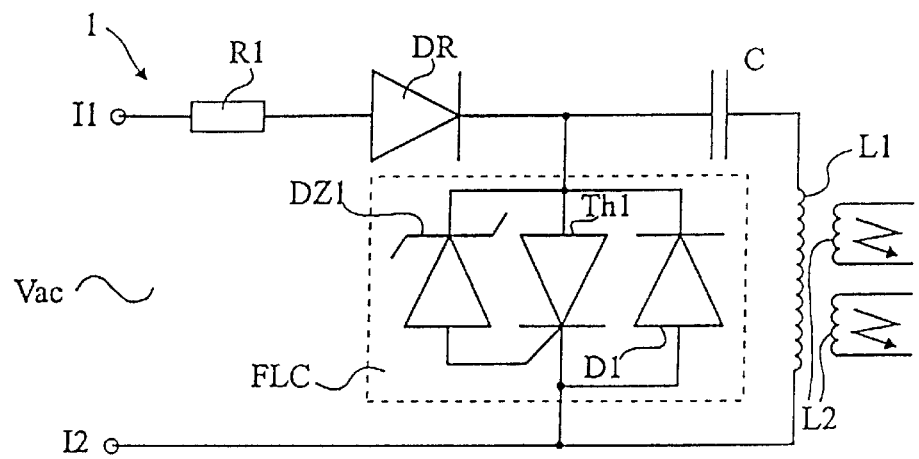
FIGS. 1 to 3, previously described, are meant to show the state of the art and the problem to solve.

The same elements have been designated with the same references in the different drawings. For clarity, only those elements necessary to the understanding of the present invention have been shown in the drawings and will be described hereafter.

Figure 4:
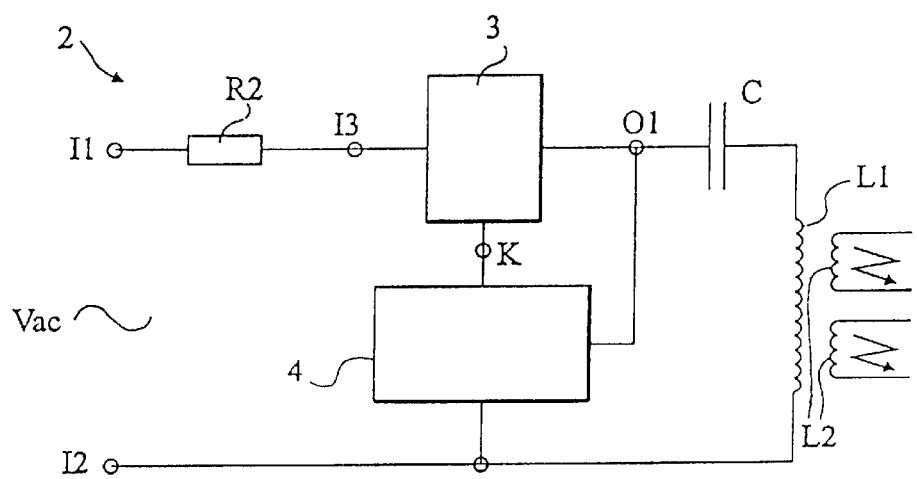
FIG. 4 very schematically shows an embodiment of an electric arc generation circuit according to the present invention.
Figure 2:
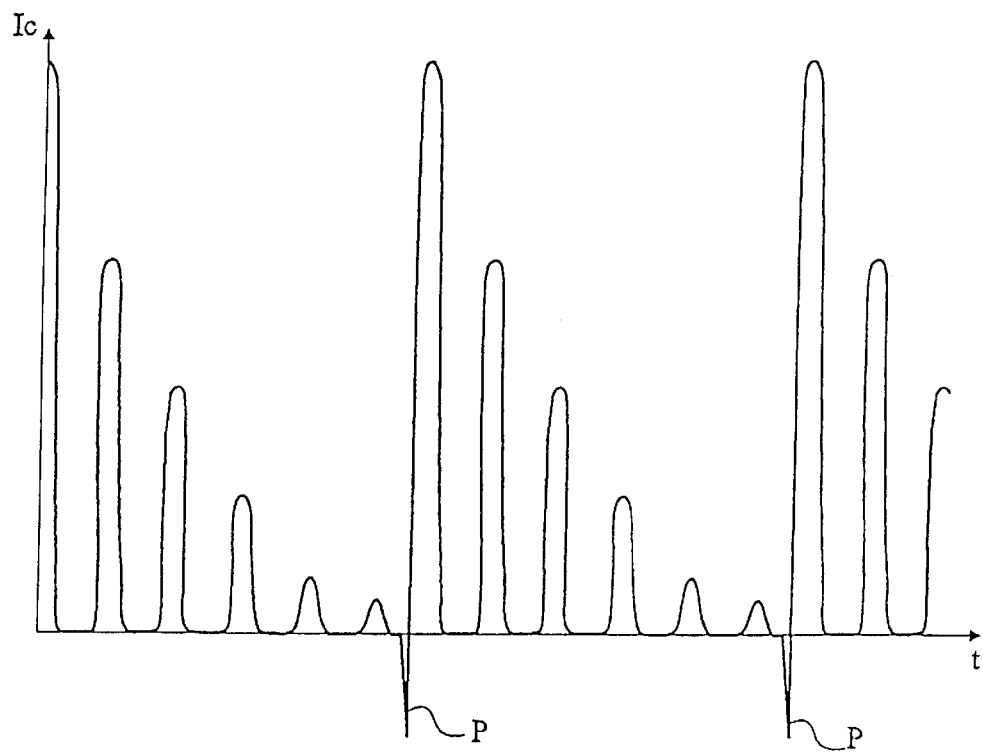
Figure 3:
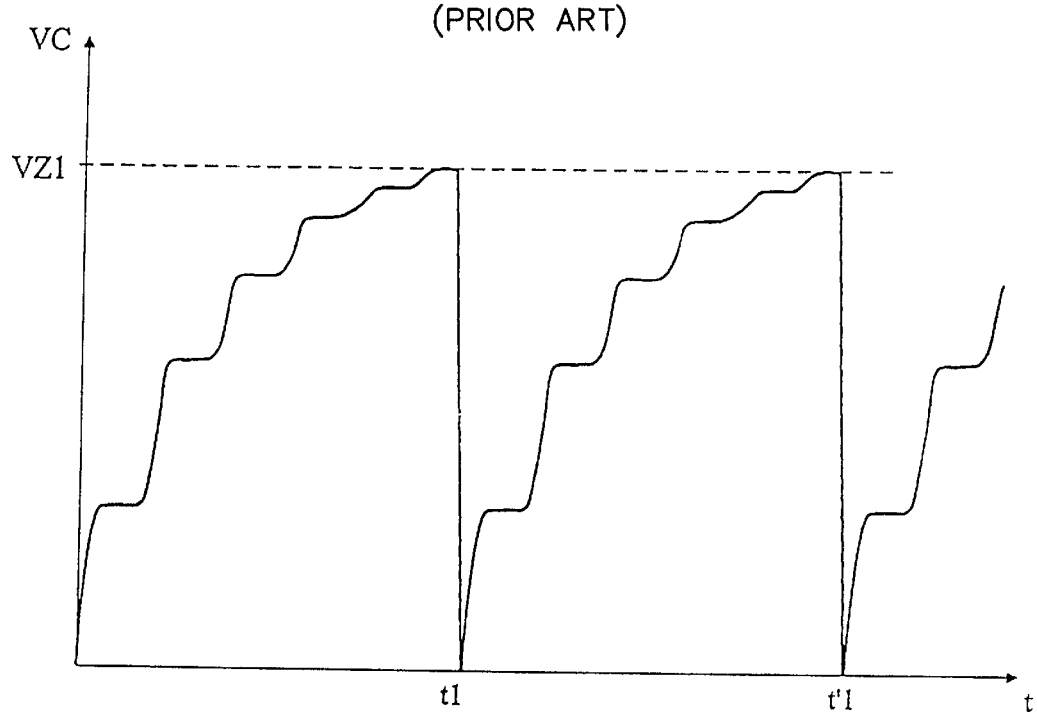

FIG. 4 very schematically shows an embodiment of an electric arc generation circuit 2 according to the present invention. Circuit 2 includes, in series between two input terminals I1 and I2, a resistor R2, a current source 3, a capacitor C, and a primary winding L1 of an isolation transistor. Terminals I1 and I2 are intended for receiving an A.C. supply voltage Vac, for example, the mains voltage.

Current source 3 according to the present invention includes an input terminal 13, an output terminal O1, and a control terminal K. Circuit 2 also includes according to the present invention a switching block 4, connected in parallel with capacitor C and winding L1 (between terminals O1 and I2). Source 3 and block 4 form together a means of organization of the charge and discharge of capacitor C.

A characteristic of the present invention is that source 3 is a constant current source. Thus, according to the present invention, the charge of capacitor C is organized at approximately constant current.

An advantage of the present invention is that, by charging the capacitor at approximately constant current, the duration (number of supply halfwaves) required for the charge and thus, thereby, the electric arc frequency, are made approximately constant.

Figure 5:
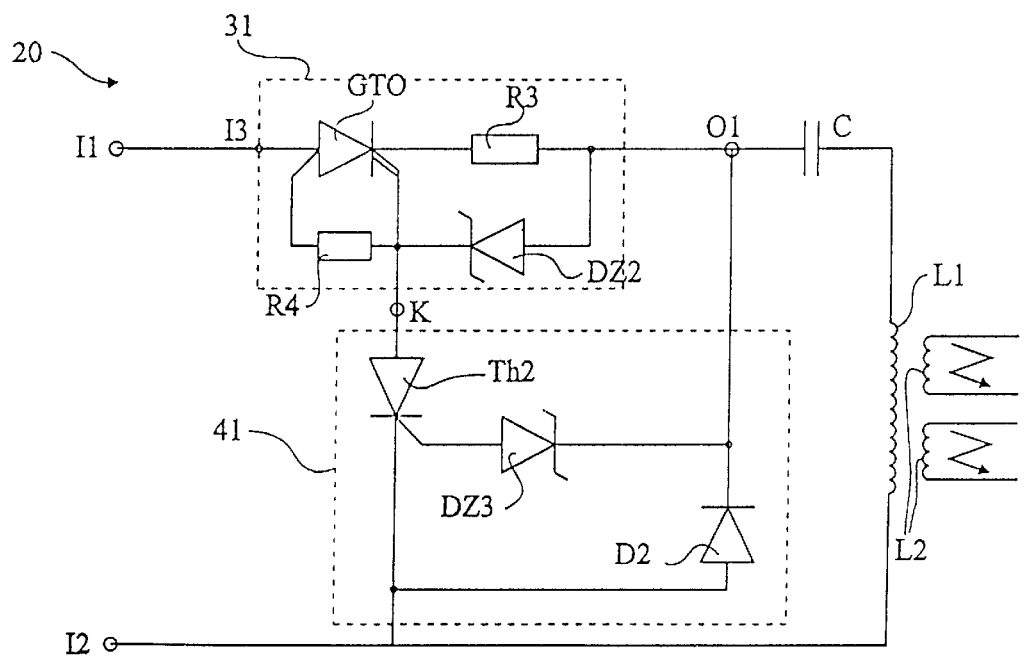
FIG. 5 shows a first detailed embodiment of the circuit in FIG. 4.

FIG. 5 shows a first detailed embodiment of an electric arc generation circuit 20 according to the present invention.

The constant current source (3, FIG. 4) is a circuit 31 including a cathode-gate turn-off thyristor (GTO). The anode of the GTO thyristor forms input terminal 13 of circuit 31. The cathode of the GTO thyristor is connected to a first terminal of a resistor R3 of relatively low value, the second terminal of which forms the output terminal O1 of circuit 31. The anode gate of the GTO thyristor is connected, via a resistor R4 of relatively high value, to its cathode gate which forms control terminal K of circuit 31. Terminal K is also connected to the cathode of a zener diode DZ2, the anode of which is connected to output terminal O1 of circuit 31, and the avalanche voltage of which has a small value as compared to voltage Vac.

The switching block (4, FIG. 4) is, according to the embodiment of FIG. 5, formed of a circuit 41 with three terminals, including a cathode-gate thyristor Th2. The anode of thyristor Th2 is connected to control terminal K of circuit 31. Its cathode is connected to terminal I2. The gate of thyristor Th2 is connected to the anode of a zener diode DZ3, the cathode of which is connected to terminal O1. Circuit 41 also includes a free wheel diode D2 between terminals O 1 and I2.

Figure 6:
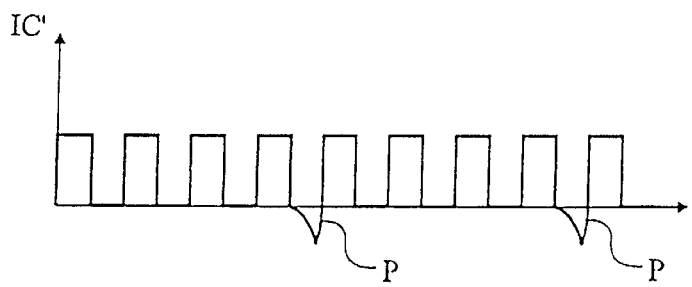
FIGS. 6 and 7 illustrate, in the form of timing diagrams, the operation of the circuit shown in FIG. 5.
Figure 7:
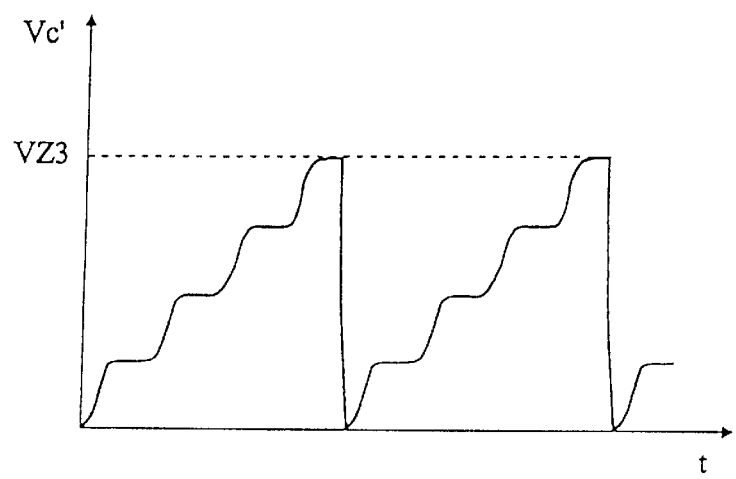

FIGS. 6 and 7 illustrate the operation of the circuit of FIG. 5. FIG. 6 shows the shape of current Ic' in capacitor C. FIG. 7 shows the shape of voltage Vc' across capacitor C for this current Ic'.

At the beginning of each positive halfwave of voltage Vac, the closing of the GTO thyristor occurs as follows. A current flows through its anode, its anode gate, resistor R4, its cathode gate and its cathode. When this current reaches the turn-on threshold of the GTO thyristor, said thyristor turns on. During this phase, thyristor Th2 is off and diode DZ2 is reverse-biased (under its threshold value). The delay before the turning-on of the GTO thyristor with respect to the voltage zero of Vac depends on the value of resistor R4.

Once the GTO thyristor has been turned on, current Ic' through capacitor C corresponds to the sum of the currents through resistor R3 and through diode DZ2. Indeed, since diode DZ2 has a small threshold value (for example, some ten volts) as compared to voltage Vac, its regulates the voltage between terminals O1 and K to a substantially constant value corresponding to this threshold value. Accordingly, the current through resistor R3 is substantially constant. Since the value of resistor R3 is small as compared to the value of resistor R4, most of the charge current flows therethrough. Thus, the higher the value of resistor R4, the more stable current Ic'. However, a value acceptable to turn on the GTO thyristor as soon as possible after the beginning of the positive halfwave and to avoid too high a dissipation in resistor R4 has to be chosen.

When voltage Vc' reaches a threshold voltage VZ3 determined by zener diode DZ3, a current appears in the gate of thyristor Th2 which turns on. Then, the GTO thyristor of circuit 31 turns off by extraction of the carriers through its cathode gate. Capacitor C then discharges (negative peaks P in FIG. 6) via diode DZ2 and thyristor Th2 into primary winding L1 of the transformer to generate electric arcs on the secondary side (by conservation of the magnetic energy, in a conventional way).

It should be noted that circuit 20 has a single-halfwave operation, the GTO thyristor being blocked during negative halfwaves.

As a specific example of implementation, for a voltage Vac of 220 volts at 50 Hz, the following values may be chosen for the components of circuit 20 of FIG. 5:

C=1 µF;
R3=5 kΩ;
R4=75 kΩ;
VZ2=10 V; and
VZ3=250 V.

With such values, the arc frequency respectively is 3.9 Hz and 5.1 Hz for voltages Vac of 170 V and 250 V.

For a voltage Vac of 110 volts at 60 Hz, the following values may be chosen:

C=1 µF;
R3=10 kΩ;
R4=75 kΩ;
VZ2=10 V; and
VZ3=120 V.

According to the desired arc frequency (discharges of capacitor C), mains voltage Vac, of a 50- or 60-Hz frequency, is applied directly or via a rectifying bridge, between terminals I1 and I2 (FIG. 1). In this latter case, the negative halfwaves are also used to charge the capacitor, and the arc frequency is doubled.

Figure 8:
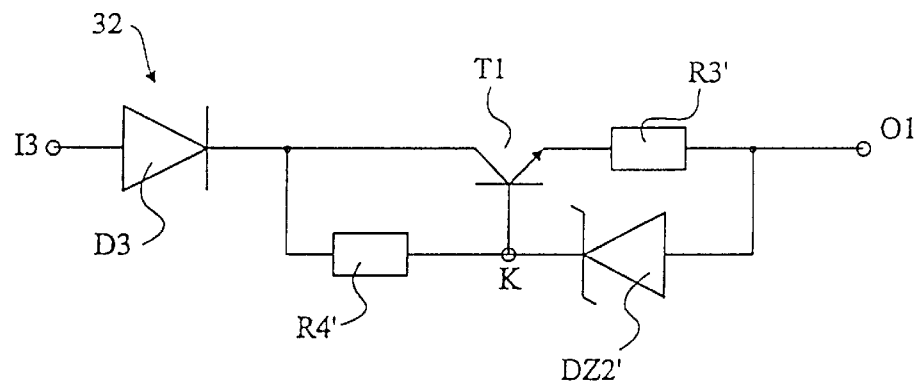
FIG. 8 shows a second detailed embodiment of a charge current source for the capacitor of the circuit in FIG. 4.

FIG. 8 shows a second embodiment of a current source 32 with three terminals I3, O1, K useable in the circuit of the present invention such as shown in FIG. 4. Such a source 32 includes an NPN-type bipolar transistor T1 having its collector connected to the cathode of a diode D3, the anode of which forms input terminal I3. The emitter of transistor T1 is connected to a first terminal of a resistor R3', the second terminal of which forms output terminal O1. The base of transistor T1 forms control terminal K. The collector and the base of transistor T1 are interconnected by a resistor R4'. The base of transistor T1 is connected to the cathode of a zener diode DZ2' of low value, the anode of which is connected to output terminal O1. The operation of current source 32 is substantially similar to that of circuit 31 (FIG. 5).

During positive halfwaves, diode DZ2' performs a function similar to that of diode DZ2 (FIG. 5) by maintaining the voltage across resistor R3' (minus the base-emitter voltage of transistor T1) substantially constant and equal to its threshold voltage. Accordingly, the current through resistor R3' is substantially constant and the charge current of the capacitor is approximately constant (set by the current through resistors R3' and R4'). Diode D3 is used to protect transistor T1 which does not withstand the reverse voltage.

As a specific example of implementation, for a voltage Vac of 220 volts at 50 Hz, the following values may be chosen for the components of circuit 32:

R3'=5.6 kΩ;
R4'=620 kΩ; and
VZ2'=10 V.

The first embodiment of constant current source 31 illustrated in FIG. 5 however is a preferred embodiment. It especially has the advantage that the GTO thyristor of circuit 31 of smaller dimensions than transistor T1 of circuit 32 has the same gain. Another advantage of circuit 31 is that it avoids using a diode (D3, circuit 32) to withstand the voltage when the GTO thyristor is off.

Figure 9:
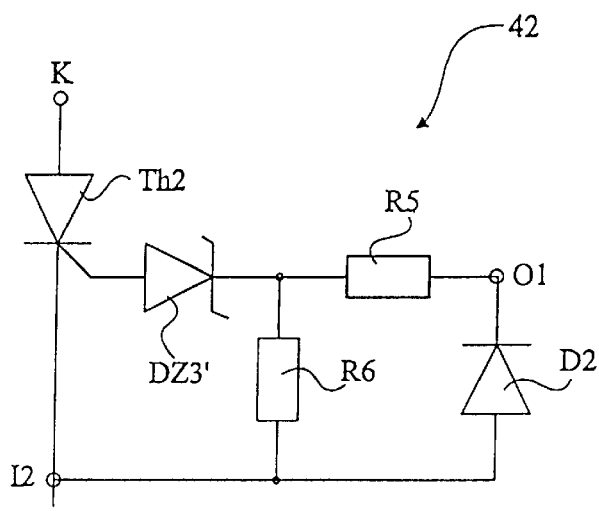
FIGS. 9 and 10 show second and third detailed embodiments of a switching block of the circuit in FIG. 4.

FIG. 9 shows a second embodiment of switching block 4 of the circuit of FIG. 4. According to this embodiment, this switching block 42 is substantially similar to circuit 41 of FIG. 5. However, the cathode of a zener diode DZ3' (replacing diode DZ3 of circuit 41) is not connected to terminal O1, but is connected to the midpoint of a resistor bridge R5, R6. More specifically, a resistor R5 is connected between the cathode of diode DZ3' and terminal O1, while a resistor R6 is connected between the cathode of diode DZ3' and terminal I2. Such a resistor bridge has the object of enabling the use of a zener diode DZ3' having a lower threshold than that of diode DZ3 of circuit 41 (FIG. 5). This has the advantage of making the turn-on threshold of the switching block less responsive to variations of supply voltage Vac. Further, this facilitates the circuit integration.

As a specific example of implementation, for a voltage Vac of 220 volts at 50 Hz, the following values may be chosen for the components of circuit 42:

R5=330 kΩ;
R6=30 kΩ; and
VZ3'=10 V.

Figure 10:
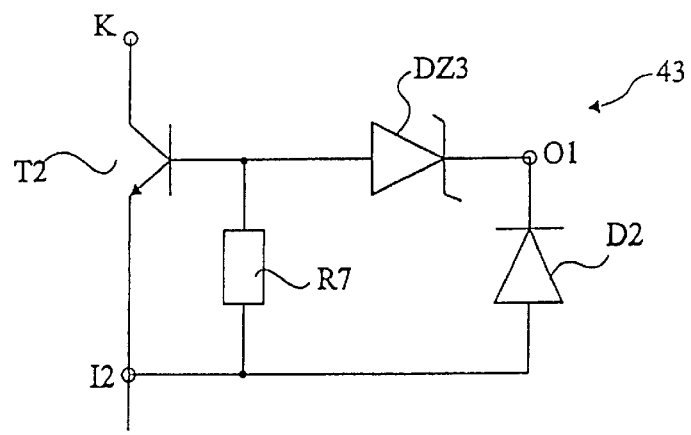

FIG. 10 shows a third embodiment of block 4 of the circuit of FIG. 4. According to this embodiment, switching block 43 differs from circuit 41 of FIG. 5 in that it includes an NPN bipolar transistor T2 replacing thyristor Th2. In this case, the collector of transistor T2 is connected to control terminal K, its emitter is connected to terminal I2 and its base is connected to the cathode of zener diode DZ3. It will be ascertained to provide a biasing resistor R7 between the emitter of transistor T2 and its base.

An advantage of the present invention is that it enables making the electric arc frequency approximately independent from possible variations of the supply voltage.

Another advantage of the present invention is that it uses a small number of components and is thus particularly economical.

Another advantage of the present invention is that all circuit components (current source and switching block) are integrable in a same integrated circuit.

The frequency of the electric arcs can be changed, either by changing the capacitance of capacitor C, or by changing the value of the constant current from the current source.

As an alternative, not shown, the switching block (4, FIG. 4) is formed of a conventional means of organization of the capacitor charge and discharge, for example, a circuit FLC such as shown in FIG. 1. In this case, control terminal K of the current source (3, FIG. 4; 31, FIG. 5; 32, FIG. 8) according to the present invention is not connected to this charge organization block and remains in the air.

An advantage of this alternative is that it enables modifying, in a simple manner, existing circuits, which already include the FLC element, by only adding a constant current source according to the present invention.

Of course, the present invention is likely to have various alterations, modifications, and improvements which will readily occur to those skilled in the art. In particular, although the present invention has been described in the specific case of a gas lighter, it may be used in any type of industrial or domestic device in which the generation of electric arcs is necessary. Further, it should be noted that the realization of resistor R4 or R4' in integrated form will preferably be done by means of a junction field effect transistor (JFET). This has the advantage of benefiting from a nonlinear current-voltage characteristic which exhibits a current asymptote. Thus, the reverse current through diode DZ2 (or DZ2') is limited and, accordingly, so is the variation of the capacitor charge current. Further, although this has not been shown, it should be noted that the circuit is off-line (like conventional circuits), that is, the generation of arcs is simply caused by the provision of voltage Vac between I1 and I2. In practice, this provision is, of course, controlled by a conventional switching means.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit of electric arc generation from an A.C. voltage, including:

at least one input terminal coupled to the A.C. voltage; and means for making an electric arc frequency substantially independent from possible amplitude variations of the A.C. voltage, the electric arc frequency being lower than a frequency of the A.C. voltage.

2. The circuit of claim 1, wherein electric arcs are generated by means of an isolation transformer, a primary winding of the isolation transformer being connected in series with a capacitor, and including means for organizing a charge and discharge of the capacitor, the charge being performed at a substantially constant current.

3. The circuit of claim 2, wherein the means for organizing the charge and discharge of the capacitor includes a constant current source and a switching block.

4. The circuit of claim 3, wherein the current source and the switching block are made in a form of a single integrated circuit.

5. The circuit of claim 3, wherein the current source includes, on a charge path of the capacitor, a first resistive element associated with a means for setting a voltage across the first resistive element.

6. The circuit of claim 5, wherein the means for setting the voltage across the first resistive element is formed of a zener diode having a low threshold with respect to the A.C. voltage, and the current source includes a means for limiting an avalanche current in the zener diode.

7. The circuit of claim 6, wherein the means for limiting the current is a means of control of a switch in series with the first resistive element.

8. The circuit of claim 3, wherein the switching block includes:

a controllable switch on a discharge path of the capacitor;

a means of detection of a charge level of the capacitor; and a free-wheel component.

9. The circuit of claim 1, wherein the A.C. voltage is a low frequency voltage.

10. An electric gas lighter, including the electric arc generation circuit of claim 1.

11. An electric arc generation circuit that generates electric sparks from an A.C. voltage supply, the circuit comprising:

a capacitor;

a charging circuit, coupled to the capacitor, that charges the capacitor with a substantially constant current;

a switching block coupled to the charging circuit; and an isolation transformer for generating the sparks, the isolation transformer having a primary winding connected in series with the capacitor;

wherein the sparks are generated at a pulse rate that is independent of amplitude variations of the A.C. voltage supply, the pulse rate being lower than a frequency of the A.C. voltage supply.

12. The electric arc generation circuit of claim 11, wherein the charging circuit comprises a constant current source.

13. The electric arc generation circuit of claim 12, wherein the constant current source comprises:

a first resistive element in a charge path of the capacitor; and a zener diode that sets a reference voltage across the first resistive element.

14. The electric arc generation circuit of claim 13, wherein the switching block causes the capacitor to discharge through the primary winding of the isolation transformer when a voltage across the capacitor exceeds the reference voltage set by the zener diode.

15. The electric arc generation circuit as claimed in claim 12, wherein the constant current source and the switching block are formed of a single integrated circuit.

16. The electric arc generation circuit of claim 11, wherein the switching block comprises:

a thyristor; and a zener diode having an anode connected to a gate of the thyristor.

17. A method of generating electric arcs from an A.C. voltage supply, the method comprising acts of;

charging a capacitor with a substantially constant current; and discharging the capacitor through a primary winding of an isolation transformer to generate the electric arcs;

wherein the electric arcs are generated at a pulse rate that is independent of amplitude variations of the A.C. voltage supply, the pulse rate being lower than a frequency of the A.C. voltage supply.

* * * * *